United States Patent
Haseley et al.

(12) 
(10) Patent No.: US 6,308,997 B1
(45) Date of Patent: Oct. 30, 2001

(54) ADD-ON TAMPER-RESISTANT LOCK DEVICE FOR COVER

(75) Inventors: Daryl R. Haseley, Orchard Park; Steven M. McHugh, Springville, both of NY (US)

(73) Assignee: McGard, Inc., Orchard Park, NY (US)

( * ) Notice: Subject to any disclaimer, the term of this patent is extended or adjusted under 35 U.S.C. 154(b) by 0 days.

(21) Appl. No.: 09/138,512

(22) Filed: Aug. 24, 1998

(51) Int. Cl.$^7$ ................................................. B65D 27/30
(52) U.S. Cl. ......................... 292/307 R; 411/432; 70/163
(58) Field of Search ................ 292/307 B, 251, 292/327, 307 R; 70/160, 163, 158; 411/432, 910, 429

(56) References Cited

U.S. PATENT DOCUMENTS

| | | | |
|---|---|---|---|
| 2,033,371 | * 3/1936 | Benaggio | 292/307 R |
| 3,060,785 | * 10/1962 | Corlett | 411/910 |
| 3,782,146 | * 1/1974 | Franke | 70/232 |
| 3,999,583 | * 12/1976 | Nelson | 151/41.75 |
| 4,284,300 | * 8/1981 | Campbell | 292/251 |
| 4,618,299 | 10/1986 | Bainbridge et al. | 411/374 |
| 4,674,931 | * 6/1987 | Schwind | 411/175 |
| 4,723,866 | * 2/1988 | McCauley | 411/397 |
| 4,726,723 | 2/1988 | Bainbridge | 411/432 |
| 4,777,812 | * 10/1988 | Haugen | 70/232 |
| 4,809,569 | * 3/1989 | Erb | 81/121.1 |
| 4,823,567 | * 4/1989 | Patton | 70/38 A |
| 4,830,414 | * 5/1989 | Davis | 292/327 |
| 4,841,753 | * 6/1989 | Patton | 70/38 C |
| 4,897,005 | * 1/1990 | Peterson | 411/175 |
| 5,112,176 | 5/1992 | McCauley et al. | 411/432 |
| 5,315,849 | * 5/1994 | Georgopoulos | 70/34 |
| 5,360,304 | 11/1994 | Notaro et al. | 411/432 |
| 5,493,883 | * 2/1996 | Myers | 70/373 |
| 5,730,567 | 3/1998 | Haseley et al. | 411/403 |
| 5,795,116 | * 8/1998 | Frank | 411/6 |
| 5,950,506 | * 9/1999 | Busse | 81/121.1 |
| 6,012,941 | * 1/2000 | Burdeuko | 439/373 |
| 6,017,177 | * 1/2000 | Lanham | 411/410 |

\* cited by examiner

*Primary Examiner*—Gary Estremsky
(74) *Attorney, Agent, or Firm*—Joseph P. Gastel

(57) ABSTRACT

A device having a cover with an edge portion which is placed in adjacent relationship to a flange when the cover is in a closed position, a lock structure for locking the cover to the flange including a nut mounted on the flange for receiving the threaded shank of a bolt which extends through a bore in the end wall of a shroud having a cavity therein which contains the head of the bolt having a curvilinear groove therein for receiving a key. A method of adding a lock structure to a cover of a device including the steps of forming a first hole in a flange of the device, mounting a nut on the flange, forming a second hole in the shroud which aligns with the first hole, mounting a shroud in the second hole, extending the shank of a bolt through a portion of the shroud mounted in the hole, with the head of the bolt being contained within a cavity in the shroud.

31 Claims, 7 Drawing Sheets

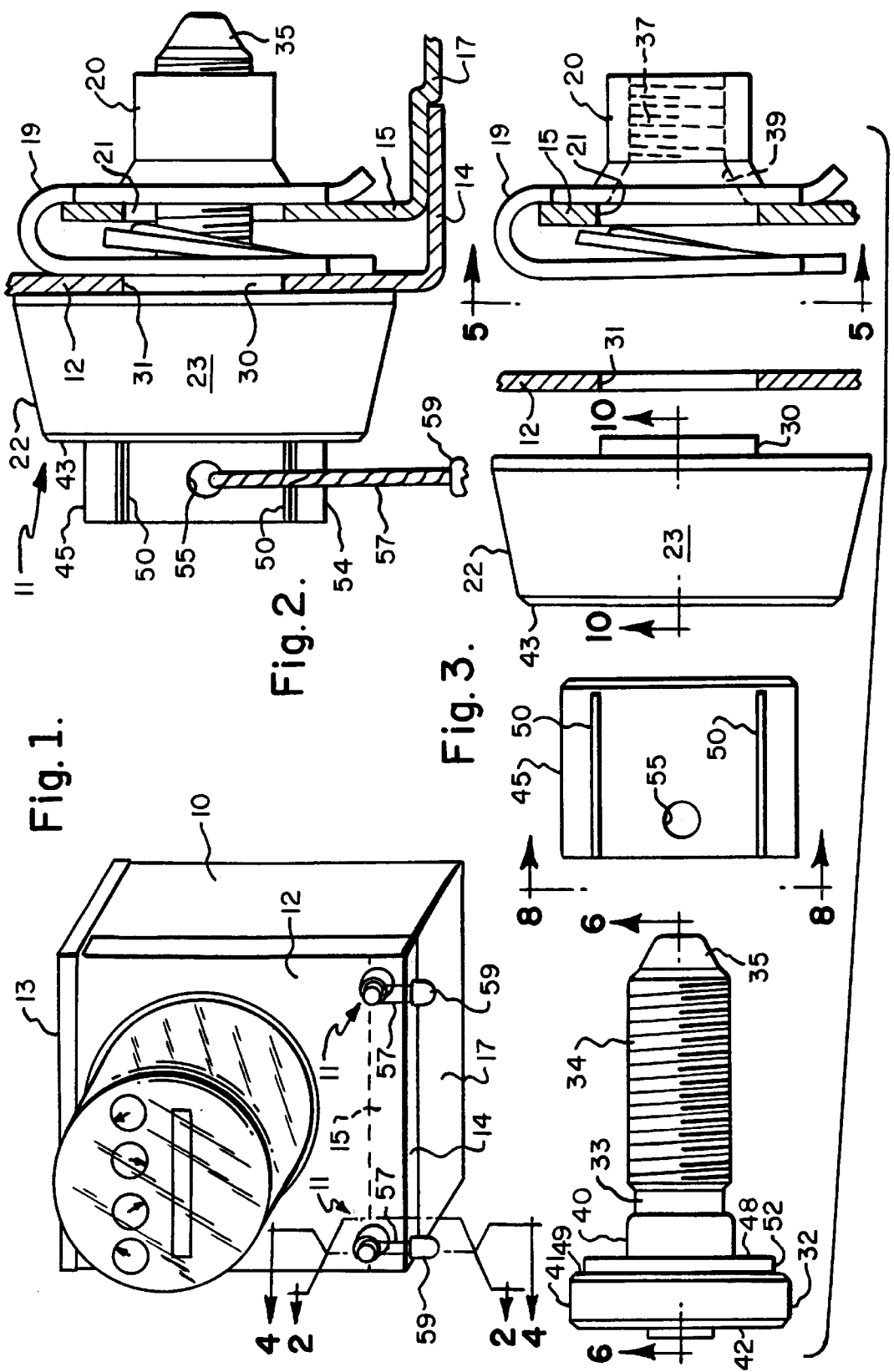

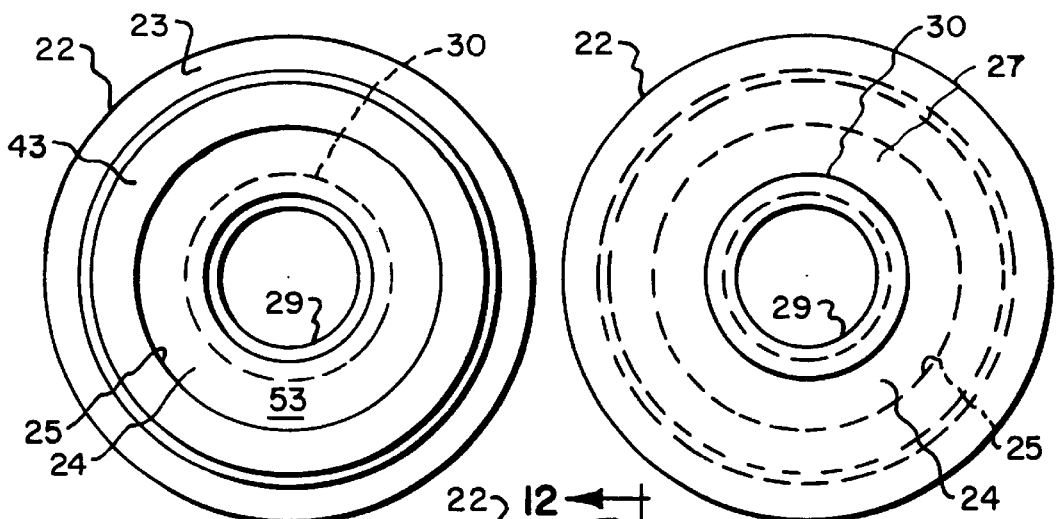
Fig. 11.  Fig. 12.
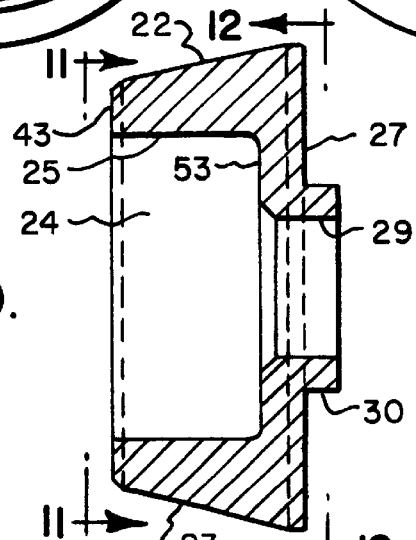
Fig. 10.
Fig. 13.
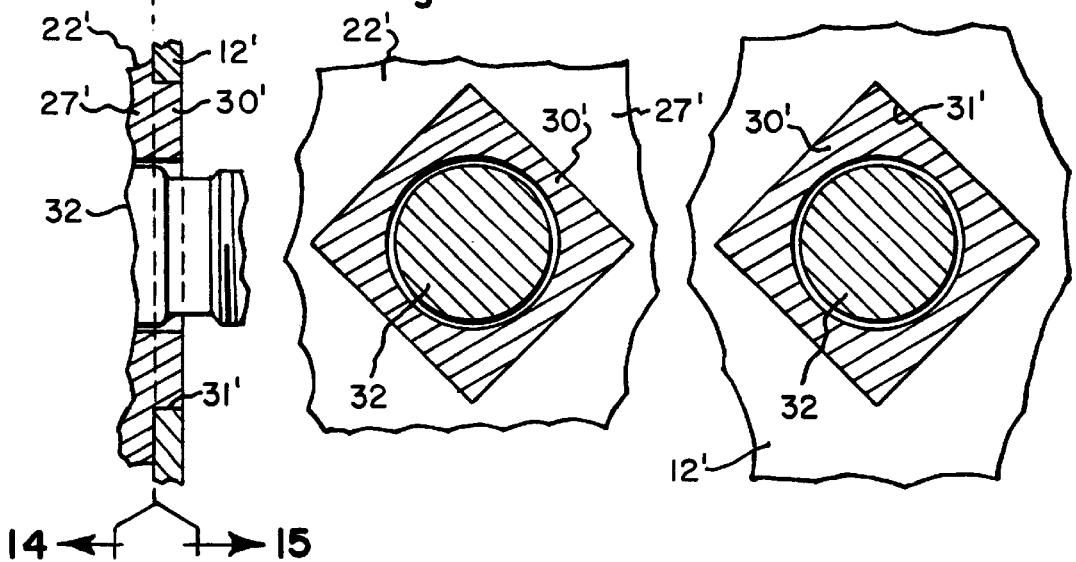
Fig. 14.  Fig. 15.

Fig. 17.
Fig. 16.
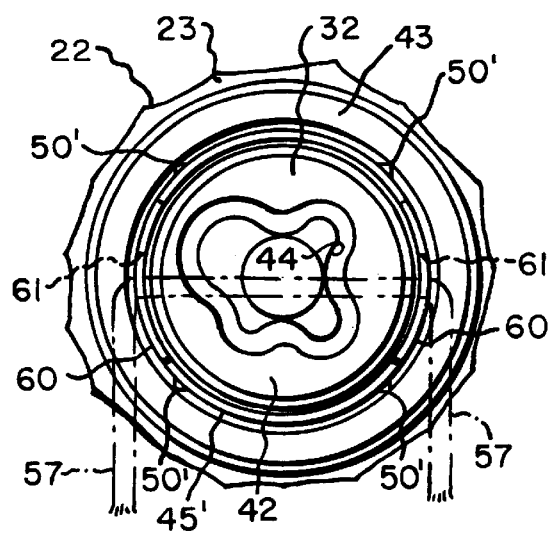
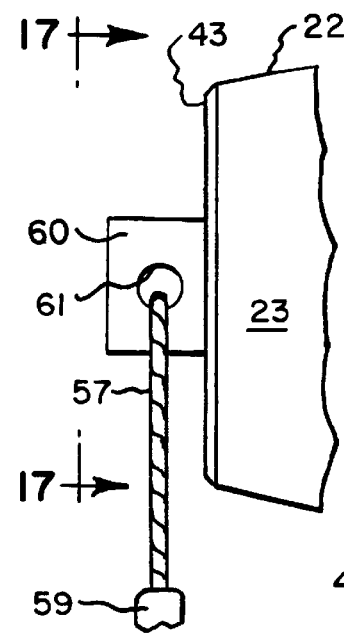
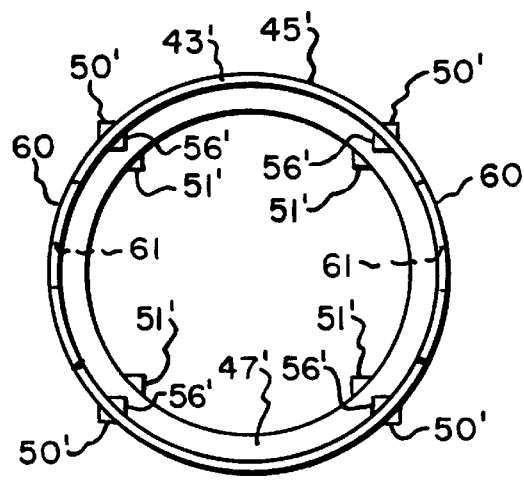
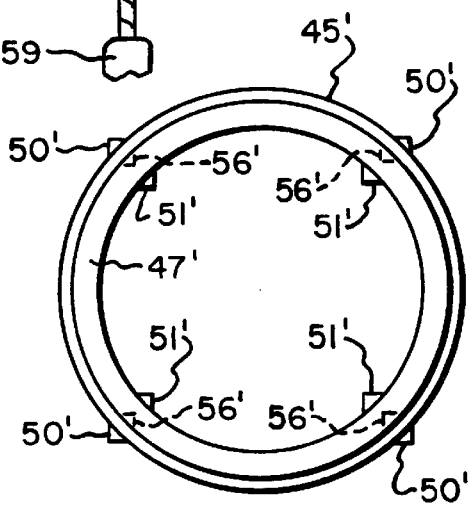
Fig. 19.
Fig. 20.
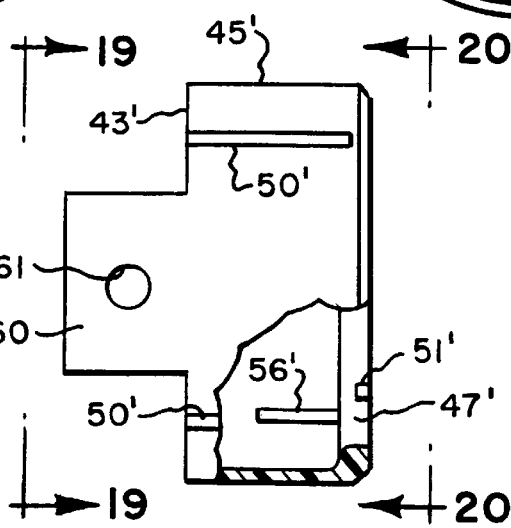
Fig. 18.

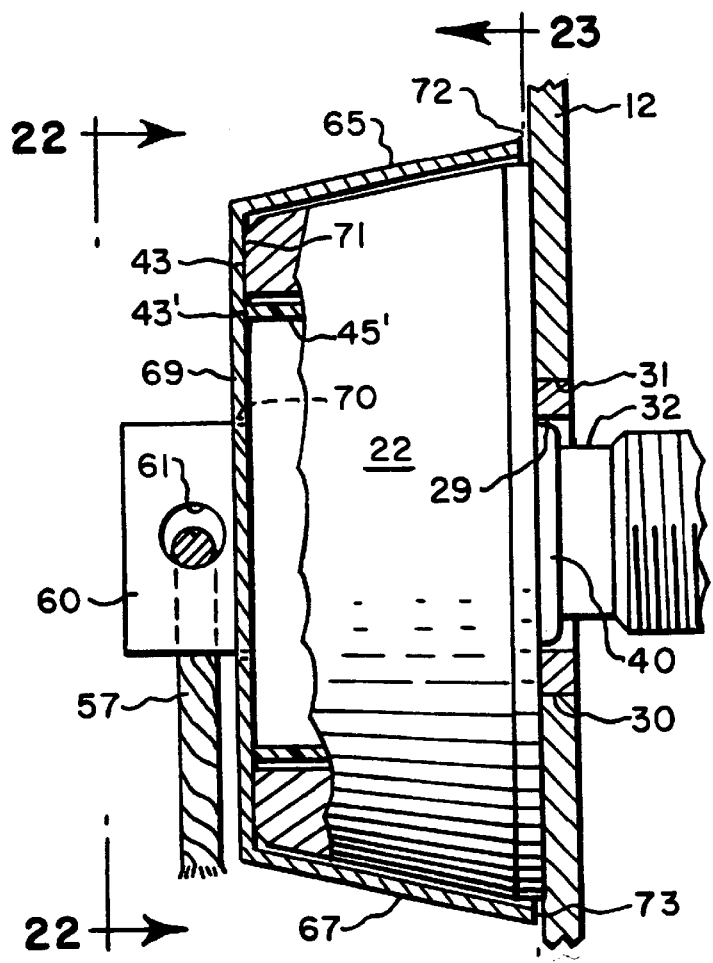
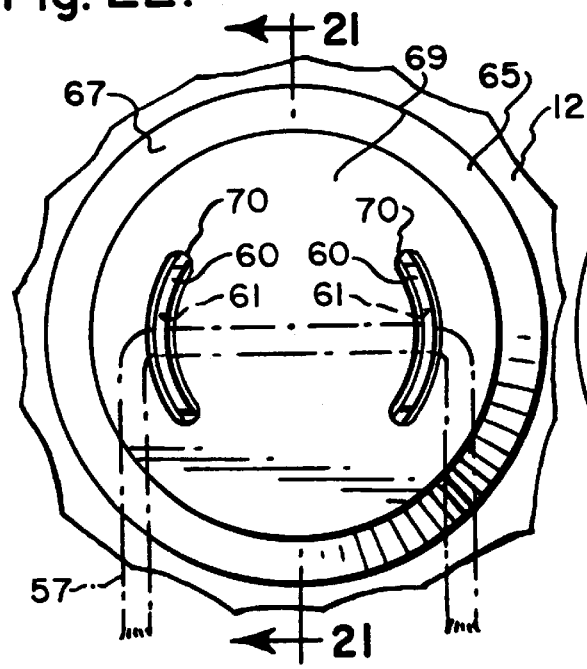
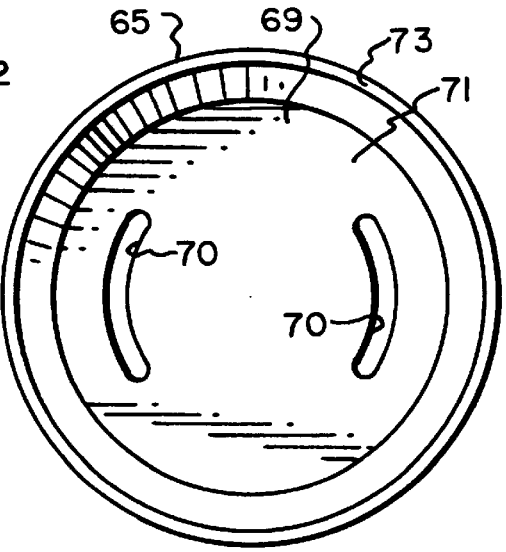

ADD-ON TAMPER-RESISTANT LOCK DEVICE FOR COVER

CROSS-REFERENCE TO RELATED APPLICATIONS

Not Applicable

STATEMENT REGARDING FEDERALLY SPONSORED RESEARCH OR DEVELOPMENT

Not Applicable

BACKGROUND OF THE INVENTION

The present invention relates to an add-on type of tamper-resistant lock structure for a cover and to a method of establishing a tamper-resistant locking connection between a cover and a device on which it is mounted.

By way of background, there are numerous boxes and other devices in existence which have covers which are movable relative to the remainder of the device. In the past various types of locking devices were used in conjunction with such devices.

BRIEF SUMMARY OF THE INVENTION

It is one object of the present invention to provide a tamper-resistant lock structure which can be added onto a device which is modified in a simple and expedient manner.

Another object of the present invention is to provide a method of establishing a tamper-resistant locking connection between a cover and another part of the device. Other objects and attendant advantages of the present invention will readily be perceived hereafter.

The present invention relates to a tamper-resistant lock structure comprising a shroud, a cavity in said shroud, an end wall in said shroud, a bore in said end wall, a bolt, a shank on said bolt extending through said bore, a head on said bolt located in said cavity, a liner in said cavity between said head and said shroud, and a key-receiving configuration on said head.

The present invention also relates to a tamper-resistant lock structure comprising a nut for affixation to a device, a shroud, an end wall on said shroud, a bore in said end wall, a bolt, a shank on said bolt extending through said bore and received in said nut, a cavity in said shroud, a liner in said cavity located between said head and said shroud, a head on said bolt located in said liner, and a key-receiving configuration on said head.

The present invention also relates to an improvement to a device having a part and a cover which moves relative to said part, the improvement of a tamper-resistant lock structure addition to said device comprising a nut attached to said part, an aperture in said cover, a shroud mounted on said cover in alignment with said nut, an end wall on said shroud, a bore in said end wall, a cavity in said shroud, an inner surface of said shroud defining said cavity, a bolt, a shank on said bolt extending through said bore in said end wall and said aperture in said shroud, a head on said bolt in said cavity, and a key-receiving configuration on said head.

The present invention also relates to a method of establishing a tamper-resistant locking connection between a cover and a flange on a device comprising the steps of forming a first aperture in said cover, forming a second aperture in said flange, placing a nut in alignment with said second aperture, providing a shroud with a cavity and an end wall and a bore in said end wall, providing a bolt having a head and a shank, inserting said shank through said bore in said end wall and through said first aperture and into said nut with said head of said nut contained in said cavity.

The various aspects of the present invention will be more fully understood when the following portions of the specification are read in conjunction with the accompanying drawings wherein:

BRIEF DESCRIPTION OF THE SEVERAL VIEWS OF THE DRAWING

FIG. 1 is a perspective view of an electric meter box mounting the tamper-resistant lock structure of the present invention;

FIG. 2 is an enlarged fragmentary side elevational view partially in cross section taken substantially along line 2—2 of FIG. 1 of the lock structure mounted on the meter box of FIG. 1;

FIG. 3 is a fragmentary exploded view of the parts of FIG. 2;

FIG. 10 is a cross sectional view of the shroud taken substantially along line 10—10 of FIG. 3;

FIG. 11 is an end elevational view of the shroud taken substantially in the direction of arrows 11—11 of FIG. 10;

FIG. 12 is an end elevational view of the shroud taken substantially in the direction of arrows 12—12 of FIG. 10;

FIG. 13 is a fragmentary cross sectional view of another shroud embodiment of the present invention;

FIG. 14 is a fragmentary cross sectional view taken substantially along line 14—14 of FIG. 13;

FIG. 15 is a fragmentary cross sectional view taken substantially along line 15—15 of FIG. 13;

FIG. 16 is a fragmentary side elevational view of another embodiment of the present invention having a different type of liner, without the protective cap which is used with this embodiment;

FIG. 17 is an end elevational view taken substantially in the direction of arrows 17—17 of FIG. 16 without the tie for the seal;

FIG. 18 is a fragmentary side elevational view, partially in cross section of the liner of FIG. 16;

FIG. 19 is an end elevational view taken substantially in the direction of arrows 19—19 of FIG. 18;

FIG. 20 is an end elevational view taken substantially in the direction of arrows 20—20 of FIG. 18;

FIG. 21 is a cross sectional view taken substantially along line 21—21 of FIG. 22 and showing the embodiment of FIG. 16 in position on the cover of the container, with certain parts omitted in the interest of clarity;

FIG. 22 is an end elevational view taken substantially in the direction of arrows 22—22 of FIG. 21;

FIG. 23 is an end elevational view taken substantially in the direction of arrows 23—23 of FIG. 21 but showing only the protective cover;

DETAILED DESCRIPTION OF THE INVENTION

Figure 5:
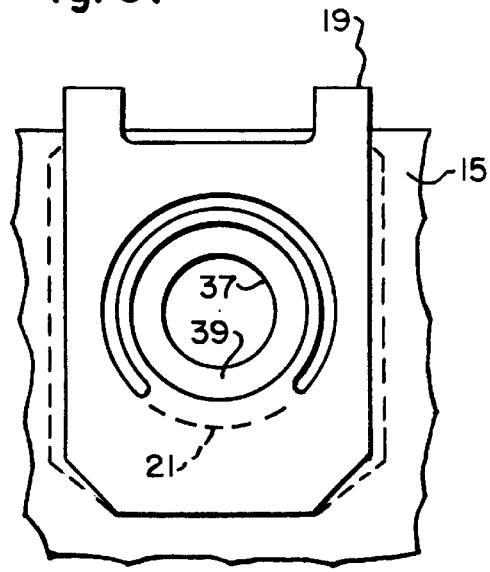
FIG. 5 is a view of the U-nut taken substantially in the direction of arrows 5—5 of FIG. 3.

In FIG. 1 an electric meter box 10 is shown mounting two tamper-resistant lock structures 11 of the present invention. The lock structures 11 are add-on devices which lock box cover 12 against being swung to an open position about a hinge (not shown) located in area 13. The lock structure 11 secures cover 12 having flange 14 thereon to flange 15 (FIG. 2) which is bent upwardly from end wall 17. It will be appreciated that one or more lock structures 11 can be used with any type of device which has a cover.

Each tamper-resistant lock structure 11 includes a U-nut 19 (FIGS. 2 and 5) which slips over and is thus attached to flange 15, and it has its internally threaded extension 20 in line with an aperture 21 which has been formed in flange 15. In this regard, flange 15 did not previously have an aperture 21 for each lock structure 11 before aperture 21 was formed as a part of the present invention. The U-nut 19 is an existing type of prior art device. It will be appreciated that any other suitable nut device which attaches to flange 15 or is otherwise added to an internal portion of box 10 for receiving bolt 32 (FIG. 3) in threaded relationship can be used in accordance with the present invention.

Each tamper-resistant lock structure 11 also includes a shroud 22 having an outer frustoconical surface 23 and a cylindrical cavity 24 (FIG. 10) defined by wall 25. Shroud 22 also has an end wall 27 with a bore 29 therein and a cylindrical boss 30 extending out of the rear of end wall 27. Boss 30 is received in aperture 31 which is formed in cover 12 (FIGS. 2, 3 and 4) so that the shroud will not move laterally on the cover. In this respect, cover 12 does not originally have apertures 31 for receiving bosses 30; apertures 31 were formed as part of the present invention. By virtue of the boss 30 being located in aperture 31, if the shroud 22 is pounded from a lateral direction, the force will be transmitted to the cover rather than to the threads 34 on shank 33.

The apertures 21 in flange 15 and the apertures 31 in cover 12 are formed in a single drilling operation when the cover is in a closed position. Thus proper alignment of apertures 21 and 31 is assured.

Figure 4:
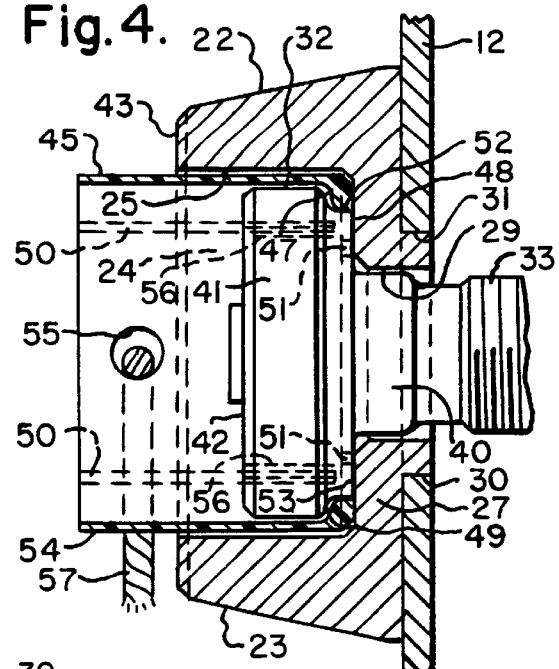
FIG. 4 is an enlarged fragmentary cross sectional view taken substantially along line 4—4 of FIG. 1 and showing only certain of the parts shown in FIG. 2.
Figure 7:
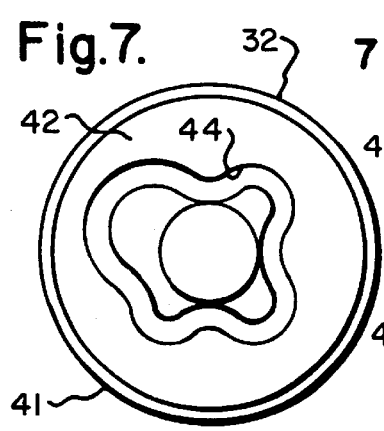
FIG. 7 is an end view of the bolt head taken substantially in the direction of arrows 7—7 of FIG. 6.

The lock structure 11 also includes a bolt 32 having a shank 33 which has threads 34 thereon. The bolt 32 also has a frustoconical end 35 which aids in aligning the bolt with threads 37 of U-nut 19 into which shank 33 is threaded. In this respect, the frustoconical end 35 is guided to threads 37 by frustoconical wall 39 (FIG. 3) of U-nut 19. The frustoconical end 35 also aids in aligning the nut 19 with shank 33 by causing it to slide to an aligned position with shank 33 in the event that it moved to a misaligned position on flange 15. Shank 33 also includes a neck 40 which is received in bore 29 of shroud 22 (FIG. 4). Bolt 32 also includes a cylindrical head 41 (FIGS. 3 and 4) which is received in shroud cavity 24. The outer surface 42 of bolt head 41 is below the end 43 of shroud 22. A curvilinear groove 44 is formed in bolt head 32 for receiving a mating key (not shown) of the type having a mating curvilinear ridge which is received in groove 44 to turn bolt 32.

Figure 6:
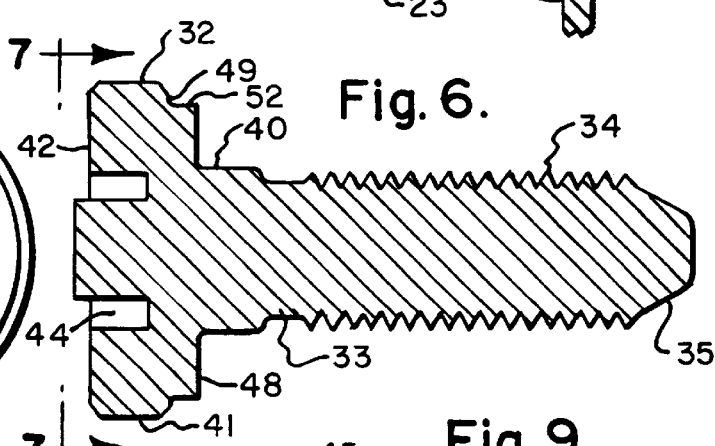
FIG. 6 is a cross sectional view of the bolt taken substantially along line 6—6 of FIG. 3.
Figure 8:
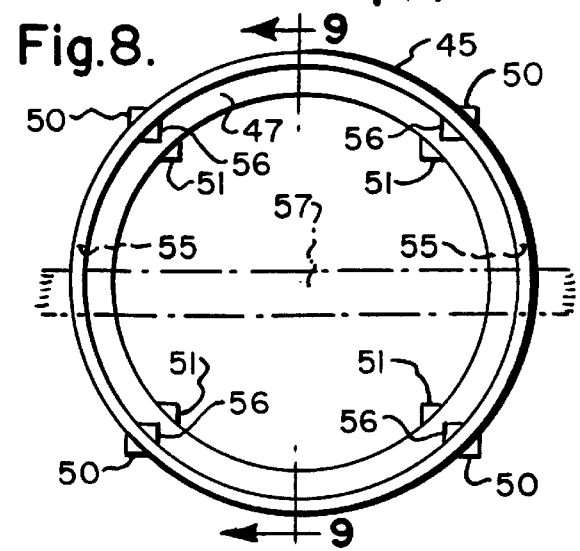
FIG. 8 is an end elevational view of the liner taken substantially in the direction of arrows 8—8 of FIG. 3.
Figure 9:
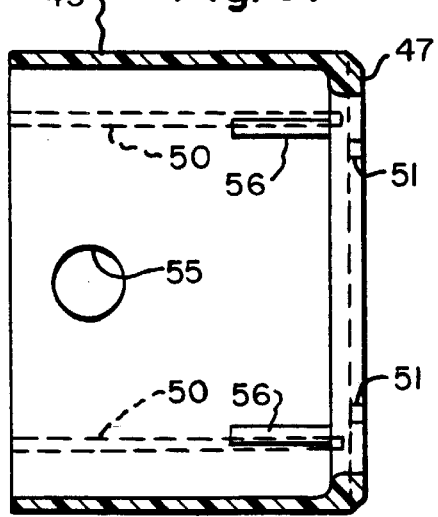
FIG. 9 is a cross sectional view of the liner taken substantially along line 9—9 of FIG. 8.

Further in accordance with the indicated embodiments of the present invention, the tamper-resistant lock structure 11 includes a liner 45 (FIGS. 3, 4, 8 and 9), fabricated out of plastic, which fits between the side of bolt head 41 (FIG. 4) and the internal surface 25 of shroud 22. Liner 45 has a rim 47 (FIGS. 4 and 8) which fits between end wall 27 of shroud 22 and the annular undersurface 49 of bolt head 41 to thereby retain liner 45 against axial movement out of shroud cavity 24. Additionally, shroud 45 has a plurality of elongated triangular protrusions 50 (FIGS. 3 and 8) on its outer surface spaced at 90° intervals, or any other suitable intervals, to provide an interference or frictional fit between liner 45 and internal wall 25 of shroud cavity 24. Additionally, a plurality of triangular protrusions 51 (FIG. 8) extend inwardly from rim 47 of liner 45, and they provide an interference or frictional fit between rim 47 and cylindrical portion 52 (FIGS. 3, 4 and 6) of bolt head 41. Also, a plurality of triangular protrusions 56 are formed on the inside surface of liner 45, and they provide an interference fit between liner 45 and cylindrical portion 32 of bolt head 41. Triangular protrusions 56 need only be of a length sufficient to frictionally engage all or part of cylindrical portion 52 of bolt head 41. The interference fit between protrusions 50 and internal shroud wall 25 and the interference fit between cylindrical bolt portion 52 and protrusions 51 and the interference fit between cylindrical bolt portion 32 and protrusion 56 thus maintain the shroud 22, bolt 32 and liner 45 in assembled relationship while permitting relative rotation therebetween, as may be necessary when bolt 32 is threaded into U-nut 19. The interference fit between the parts also permits the assembled bolt, liner and shroud to be digitally manipulated as a unit in mounting these parts on the cover 12. The thickness of cylindrical portion 52 is greater than the thickness of liner rim 47 so that when surface 48 of cylindrical portion 52 is fully seated against surface 53 of shroud end wall 27, rim 47 is not squeezed between surface 53 of end wall 27 and annular surface 49 of bolt head 32.

Liner 45 has an end portion 54 (FIGS. 2 and 4) which extends outwardly beyond the end 43 of shroud 22. End portion 54 has a pair of diametrically opposite apertures 55 therein which receive tie 57, the ends of which are secured to a seal 59, or any other suitable tamper-indicating device. It can thus be seen from FIG. 8 that since tie 57 extends between apertures 55, a ridged key cannot pass tie 57 to mate with curvilinear groove 44 in bolt head 41 unless tie 57 is first removed.

In FIGS. 13–15 a modified shroud construction is disclosed. The shroud 22' is identical in all respects to shroud 22 previously described except that the boss 30', which is analogous to boss 30 of shroud 22, is square and it fits into a square opening 31' in cover 12', which is analogous to cover 12 of FIG. 1. This construction prevents shroud 22' from rotating relative to cover 12'. It will be appreciated that any noncircular shape of a boss analogous to boss 30' and its complementary opening can be used to provide a nonrotatable fit.

In FIGS. 16–23 a further embodiment of the present invention is disclosed. In this embodiment the shroud 22 and bolt 32 are identical to those described above relative to FIGS. 1–12. Also, if desired, the shroud may be identical to shroud 22' of FIGS. 13–15. The only difference in the lock structure of FIGS. 16–23 is in the configuration of liner 45', which is analogous to liner 45 of FIGS. 1–12. The liner 45' does not have the cylindrical extension 54 (FIG. 4) of shroud 45. Instead it has two arcuate ears 60 which extend beyond end 43' of liner 45' and end 43 of shroud 22. These ears each have an aperture 61 therein. The diametrically opposite apertures 61 receive the tie 57 having ends which are secured in seal 59 (FIGS. 1 and 2). Aside from the foregoing, the liner 45' has protrusions 50', 51' and 56' which are analogous to protrusions 50, 51 and 56, respectively, of FIGS. 8 and 9. Also, the liner 45' has a rim 47' which is analogous to rim 47 of FIG. 9. The protrusions 50', 51' and 56' function in the same manner as described above relative to protrusions 50, 51 and 56, respectively. Also, the rim 47' functions in the same manner as rim 47 of FIG. 9.

The embodiment of FIGS. 16–23 includes a protective cap 65 which fits over shroud 22 as shown in FIGS. 21–23. More specifically, protective cap 65 includes a frustoconical wall 67 and an end wall 69. A pair of arcuate slots 70 are located in end wall 69 and they receive ears 60 as shown. Protective cap 65 is dimensioned so that when inner surface 71 of end wall 69 abuts end 43 of shroud 22, there will be a slight annular clearance at 72 between the annular end 73 of protective cap 65 and the surface of wall 12. As noted above, the tie 57 extends through spaced apertures 61 in ears 67. Thus, when tie 57 is in its position, protective cap 67 prevents access to the surface of bolt head 32.

While every shroud embodiment described above includes a boss, it will be appreciated that the shroud can function to cooperate in providing the tamper-resistant operation without a boss. In this respect, the end wall of the shroud may be pressed against cover 12, or it may be spaced therefrom so that it can rotate on its associated bolt, as shown in FIGS. 24–26.

Figure 24:
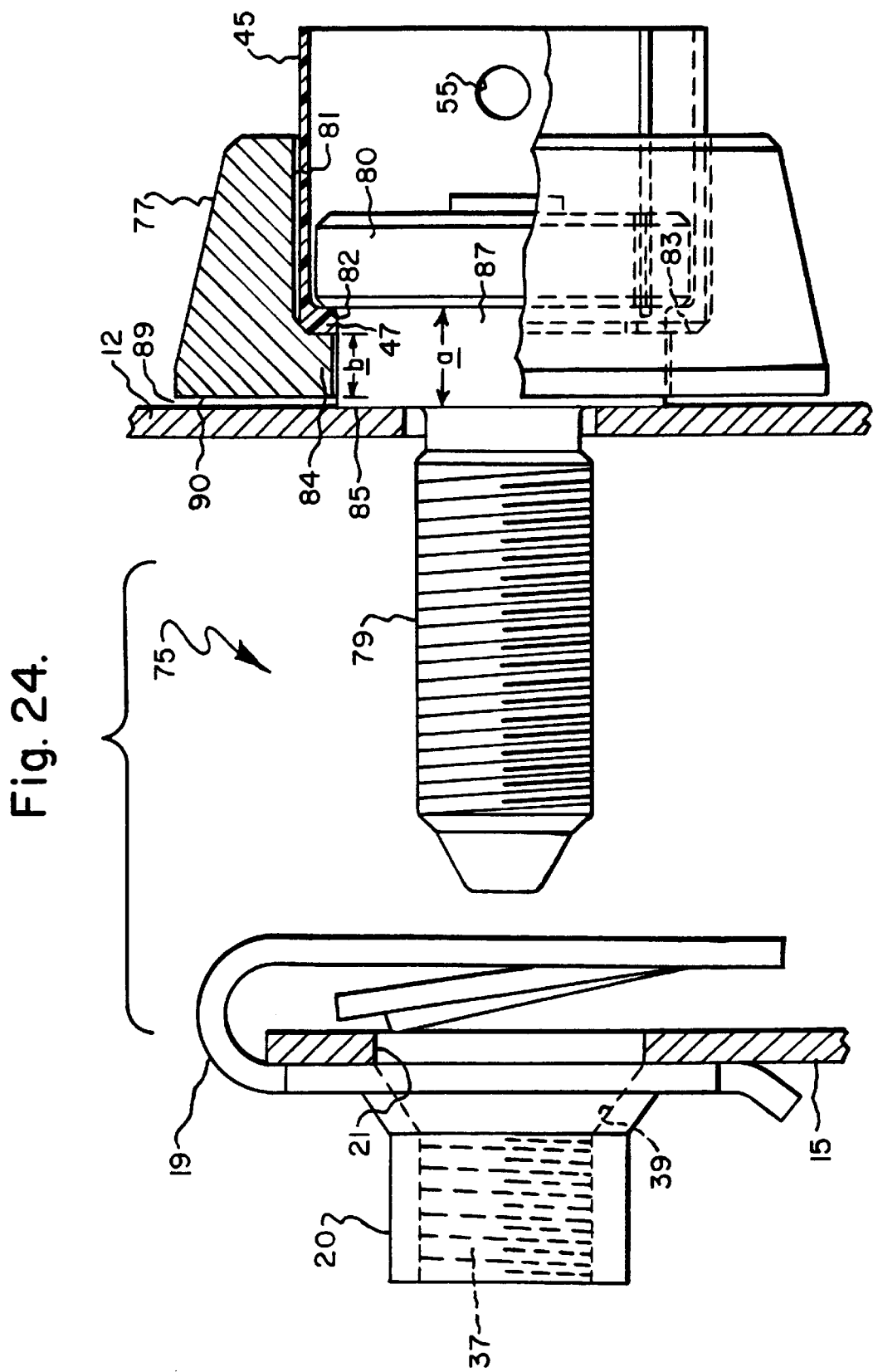
FIG. 24 is an exploded side elevational view partially in cross section, of another embodiment of the present invention.

In FIG. 24 a lock construction 75 is shown wherein shroud 77 is rotatably mounted on bolt 79. The lock structure 75 includes a U-nut 19 mounted on flange 15 as described in detail above relative to FIGS. 2, 3 and 5. In addition, the bolt 79 includes a head 80 having a curvilinear groove therein (not shown) which is of the type shown in FIG. 7 for receiving a key. Shroud 77 has a frustoconical outer surface and it includes a cavity 81 therein and a liner 45, which is identical in all respects to liner 45 of FIGS. 8 and 9. Liner 45 is positioned in cavity 81, as shown, with its rim 47 located between the annular edge 82 of bolt head 80 and the annular edge 83 of end wall 84 of shroud 77.

In the embodiment of FIG. 24, bolt 79, when threaded into U-nut 19, has the annular surface 85 of cylindrical bolt portion 87 pressed against cover 12. The axial length a of bolt portion 87 is larger than the axial length b of end wall 84 of shroud 77. Therefore, there will be a clearance 89 between the end 90 of shroud 77 and the surface of end wall 12 which permits shroud 77 to spin or rotate on bolt 79. This is advantageous, as well known in the prior art, so that if a wrench is applied to the surface of shroud 77, the latter will merely spin on bolt 79 without transmitting any torque to bolt 79. The liner 45 functions in all respects in the same manner noted above relative to the other embodiments of the invention.

Figure 25:
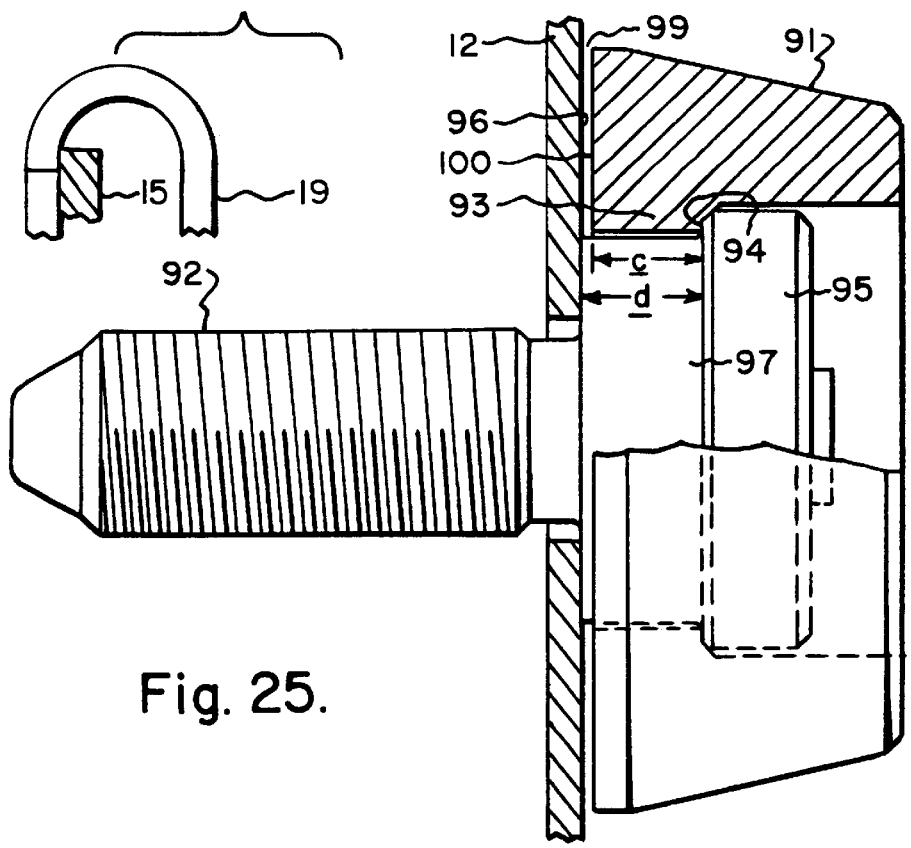
FIG. 25 is a fragmentary side elevational view, partially in cross section, of still another embodiment of the present invention.
Figure 26:
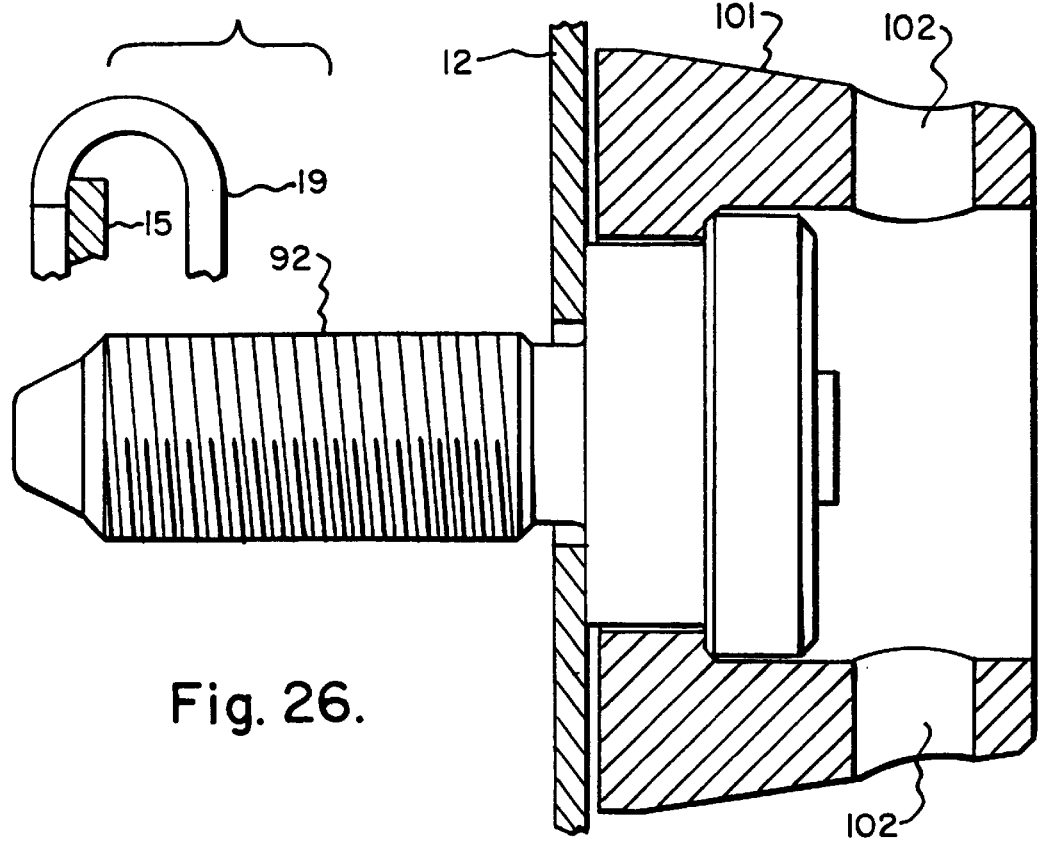
FIG. 26 is a fragmentary side elevational view, partially in cross section, of still another embodiment of the present invention.

In FIG. 25 another embodiment of the present invention is disclosed wherein shroud 91, which has a frusto-conical outer surface, is rotatably mounted on bolt 92. Shroud 91 includes an annular end wall 93 which is located between the annular edge 94 of bolt head 95 and the surface 96 of cover 12. The annular end wall 93 of shroud 91 is dimensioned so that its axial length c is smaller than the axial length d of cylindrical portion 97 of bolt 92 thereby providing a clearance 99 between surface 100 of shroud 91 and surface 96 of cover 12. Thus, shroud 91 can rotate or spin on bolt 92. The only basic difference between the embodiment of FIG. 24 and the embodiment of FIG. 25 is that the latter does not have a liner 45. The embodiment of FIG. 25 is used with the shown U-nut 19 and as described above relative to FIG. 24.

In FIG. 26 a still further embodiment of the present invention is disclosed wherein the bolt 92 may be identical in all respects to bolt 92 of FIG. 25. The shroud 101 varies only from shroud 91 of FIG. 25 in that it has a greater axial length so that a pair of diametrically opposed bores 102 can be made therein to receive a tie such as 57 and an associated seal such as 59 described above relative to FIGS. 2 and 4. The embodiment of FIG. 26 is used with the shown U-nut 19 and as described above relative to FIG. 24.

While the above embodiments have shown a U-nut 19 mounted on a specific flange 15, it will be appreciated that it is within the scope of the present invention to mount a nut on any other flange relative to which the cover moves or on any other portion of a device as a part of a lock assembly wherein a shroud and a bolt of the above types are mounted on a cover.

While the interference fit between the bolt and liner and shroud in the various embodiments has been described above as being effected by protrusions on the liner, it will be appreciated that the interference fit can be effected by frictional or interference engagement between the parts without the use of protrusions or can be effected by protrusions of other configurations. Furthermore, if desired, the frictional or interference engagement can be between only one of the bolt and the liner or the liner and the shroud. Also, while the above description has disclosed a frictional or interference fit between the bolt and the liner and/or the shroud and the liner, it will be appreciated that there need be no interference or frictional fit between the foregoing parts when it is desired to use the liner for the sole purpose of mounting a tie and a seal, as described above.

While preferred embodiments of the present invention have been disclosed, it will be appreciated that it is not limited thereto but may be otherwise embodied within the scope of the following claims.

What is claimed is:

1. In a device having a cover with a portion which is placed in adjacent relationship to a flange when the cover is in a closed position, the improvement of a tamper-resistant lock structure for locking said cover to said flange comprising a nut mounted on said flange and having a threaded bore for receiving a bolt, an aperture in said edge of said cover in alignment with said threaded bore when said cover is in said closed position, a shroud having a cavity and an end wall with a bore therein, a bolt having a threaded shank extending through said aperture and said bore for being received in said threaded bore, a head on said bolt recessed within said cavity, a key receiving configuration on said head, and a liner extending axially between the outer circumferential surface of said head and the inner circumferential surface of said shroud.

2. In a device as set forth in claim 1 including first protrusions on said liner between said liner and said bolt head, and second protrusions between said liner and said shroud, said first and second protrusions maintaining said bolt in assembled relationship with said shroud.

3. In a device as set forth in claim 1 wherein said bolt includes an undersurface on said head, and a transversely extending rim on said liner located between said end wall and said undersurface of said head.

4. In a device as set forth in claim 3 including first protrusions on said liner between said liner and said bolt head, and second protrusions between said liner and said shroud, said first and second protrusions maintaining said bolt in assembled relationship with said shroud.

5. In a device as set forth in claim 3 including a portion extending outwardly on said undersurface of said head and having a diameter which is smaller than the inner diameter of said rim and having a thickness which is greater than the thickness of said rim.

6. In a device as set forth in claim 5 including first protrusions on said liner between said liner and said bolt head, and second protrusions between said liner and said shroud, said first and second protrusions maintaining said bolt in assembled relationship with said shroud.

7. In a device as set forth in claim 1 including a liner end on said liner which extends outwardly beyond said shroud, and spaced holes in said liner end for receiving a tie which extends therebetween and overlies said head of said bolt.

8. In a device as set forth in claim 1 including means providing an interference fit between said liner and said shroud and said bolt.

9. In a device as set forth in claim 1 including means for providing an interference fit between said liner and at least one of said shroud and said bolt.

10. In a device having a cover with a portion which is placed in adjacent relationship to a flange when the cover is in a closed position, the improvement of a tamper-resistant lock structure for locking said cover to said flange comprising a nut mounted on said flange and having a threaded bore for receiving a bolt, an aperture in said edge of said cover in alignment with said threaded bore when said cover is in said closed position, a shroud having a cavity and an end wall with a bore therein, a bolt having a threaded shank extending through said aperture and said bore for being received in said threaded bore, a head on said bolt recessed within said cavity, a key receiving configuration on said head, a boss on said end wall in said aperture, said bore in said end wall extending through said boss, a liner located between said head and said shroud, and means for providing an interference fit between said liner and at least one of said shroud and said bolt.

11. In a device having a cover with a portion which is placed in adjacent relationship to a flange when the cover is in a closed position, the improvement of a tamper-resistant lock structure for locking said cover to said flange comprising a nut mounted on said flange and having a threaded bore for receiving a bolt, an aperture in said edge of said cover in alignment with said threaded bore when said cover is in said closed position, a shroud having a cavity and an end wall with a bore therein, a bolt having a threaded shank extending through said aperture and said bore for being received in said threaded bore, a head on said bolt recessed within said cavity, a key receiving configuration on said head, a boss on said end wall in said aperture, said bore in said end wall extending through said boss, a liner located between said head and said shroud, first protrusions on said liner between said liner and said bolt head, and second protrusions between said liner and said shroud, said first and second protrusions maintaining said bolt in assembled relationship with said shroud.

12. In a device having a cover with a portion which is placed in adjacent relationship to a flange when the cover is in a closed position, the improvement of a tamper-resistant lock structure for locking said cover to said flange comprising a nut mounted on said flange and having a threaded bore for receiving a bolt, an aperture in said edge of said cover in alignment with said threaded bore when said cover is in said closed position, a shroud having a cavity and an end wall with a bore therein, a bolt having a threaded shank extending through said aperture and said bore for being received in said threaded bore, a head on said bolt recessed within said cavity, a key receiving configuration on said head, a boss on said end wall in said aperture, said bore in said end wall extending through said boss, a liner located between said head and said shroud, said bolt including an undersurface on said head, a rim on said liner located between said end wall and said undersurface of said head, a portion extending outwardly on said undersurface of said head and having a diameter which is smaller than the inner diameter of said rim and having a thickness which is greater than the thickness of said rim, a liner end on said liner which extends outwardly beyond said shroud, and spaced holes in said liner end for receiving a tie which extends therebetween and overlies said head of said bolt.

13. In a device as set forth in claim 12 including means for providing an interference fit between said liner and at least one of said shroud and said bolt.

14. In a device having a cover with a portion which is placed in adjacent relationship to a flange when the cover is in a closed position, the improvement of a tamper-resistant lock structure for locking said cover to said flange comprising a nut mounted on said flange and having a threaded bore for receiving a bolt, an aperture in said edge of said cover in alignment with said threaded bore when said cover is in said closed position, a shroud having a cavity and an end wall with a bore therein, a bolt having a threaded shank extending through said aperture and said bore for being received in said threaded bore, a head on said bolt recessed within said cavity, a key receiving configuration on said head, a liner located between said head and said shroud, said bolt including an undersurface on said head, a rim on said liner located between said end wall and said undersurface on said head, a portion extending outwardly on said undersurface of said head and having a diameter which is smaller than the inner diameter of said rim and having a thickness which is greater than the thickness of said rim, a liner end on said liner which extends outwardly beyond said shroud, and spaced holes in said liner end for receiving a tie which extends therebetween and overlies said head on said bolt.

15. In a device having a cover with a portion which is placed in adjacent relationship to a flange when the cover is in a closed position, the improvement of a tamper-resistant lock structure for locking said cover to said flange comprising a nut mounted on said flange and having a threaded bore for receiving a bolt, an aperture in said edge of said cover in alignment with said threaded bore when said cover is in said closed position, a shroud having a cavity and an end wall with a bore therein, a bolt having a threaded shank extending through said aperture and said bore for being received in said threaded bore, a head on said bolt recessed within said cavity, a key receiving configuration on said head, said shroud being rotatably mounted on said bolt, and a liner extending axially between the outer circumferential surface of said head and the inner circumferential surface of said shroud.

16. In a device as set forth in claim 15 including means for providing an interference fit between said liner and at least one of said shroud and said bolt.

17. In a device as set forth in claim 15 wherein said bolt includes an undersurface on said head and a rim on said liner located between said end wall and said undersurface of said head.

18. In a device as set forth in claim 17 including a portion extending outwardly on said undersurface of said head and having a diameter which is smaller than the inner diameter of said rim and having a thickness which is greater than the thickness of said rim.

19. In a device as set forth in claim 18 including means for providing an interference fit between said liner and at least one of said shroud and said bolt.

20. In a device having a part and a cover which moves relative to said part, the improvement of a tamper-resistant lock structure addition to said device comprising a nut attached to said part, an aperture in said cover, a shroud mounted on said cover in alignment with said nut, an end wall on said shroud, a bore in said end wall, a cavity in said shroud, an inner surface of said shroud defining said cavity, a bolt, a shank on said bolt extending through said bore in said end wall and said aperture in said cover, a head on said bolt in said cavity, a key-receiving configuration on said head, a liner in said cavity between said inner surface of said cavity and said head, and a friction fit between said head and said liner and said inner surface of said shroud.

21. In a device as set forth in claim 20 wherein said friction fit comprises first protrusions on said liner between said head and said liner, and second protrusions on said liner between said liner and said inner surface.

22. A tamper-resistant lock structure comprising a nut for affixation to a device, a shroud, an end wall on said shroud, a bore in said end wall, a bolt, a threaded shank on said bolt extending through said bore and received in said nut, a cavity in said shroud, a liner in said cavity located between said head and said shroud, a head on said bolt located in said liner, a key-receiving configuration on said head, a rim on said liner located between said head and said end wall, and an interference fit between said liner and said shroud and between said liner and said bolt.

23. A tamper-resistant lock structure comprising a nut for affixation to a device, a shroud, an end wall on said shroud, a bore in said end wall, a bolt, a threaded shank on said bolt extending through said bore and received in said nut, a cavity in said shroud, a liner in said cavity located between said head and said shroud, a head on said bolt located in said liner, a key-receiving configuration on said head, said shroud being rotatable on said nut, and spaced tie-receiving bores in said liner spaced outwardly from said shroud.

24. A tamper-resistant lock structure comprising a shroud, a cavity in said shroud, an end wall in said shroud, a bore in said end wall, a bolt, a shank on said bolt extending through said bore, a head on said bolt located in said cavity, a liner in said cavity between said head and said shroud, a key-receiving configuration on said head, and an interference fit between said liner and said bolt and between said liner and said shroud.

25. A method of establishing a tamper-resistant locking connection between a cover and a flange on a device comprising the steps of forming a first aperture in said cover, forming a second aperture in said flange, mounting a nut on said flange in alignment with said second aperture, providing a shroud with a cavity and an end wall and a bore in said end wall, providing a bolt having a shank and a head with a key-receiving configuration, inserting said shank through said bore in said end wall and through said first aperture and into said nut with said head of said nut contained in said cavity, and said first and second apertures being formed in a single operation when said cover is in overlying relationship to said flange.

26. In a device having a part and a cover which moves relative to said part, the improvement of a tamper-resistant lock structure addition to said device comprising a nut attached to said part, an aperture in said cover, a shroud mounted on said cover in alignment with said nut, an end wall on said shroud, a bore in said end wall, a cavity in said shroud, an inner surface of said shroud defining said cavity, a bolt, a shank on said bolt extending through said bore in said end wall and said aperture in said cover, a head on said bolt in said cavity, a key-receiving configuration on said head, and a boss on said end wall located in said aperture in said cover, said boss being non-rotatable in said aperture in said cover.

27. In a device as set forth in claim 26 wherein said boss and said aperture in said cover are complementary.

28. In a device as set forth in claim 26 wherein said end wall of said shroud presses against said cover.

29. In a device having a part and a cover which moves relative to said part, the improvement of a tamper-resistant lock structure addition to said device comprising a nut attached to said part, an aperture in said cover, a shroud mounted on said cover in alignment with said nut, an end wall on said shroud, a bore in said end wall, a cavity in said shroud, an inner surface of said shroud defining said cavity, a bolt, a shank on said bolt extending through said bore in said end wall and said aperture in said cover, a head on said bolt in said cavity, a key-receiving configuration on said head, and a boss on said end wall located in said aperture in said cover, said end wall of said shroud pressing against said cover.

30. A tamper-resistant lock structure comprising a U-nut, a shroud, an end wall on said shroud, a bore in said end wall, a bolt, a neck on said bolt received in said bore, a shank on said bolt received in said nut, a cavity in said shroud, a head on said bolt located in said cavity, a key-receiving configuration on said head, and said shroud including an outer frustoconical surface.

31. In a device having a part and a cover which moves relative to said part, the improvement of a tamper-resistant lock structure addition to said device comprising a U-nut attached to said part, an aperture in said cover, a shroud mounted on said cover in alignment with said nut, an end wall on said shroud, a bore in said end wall, a bolt, a neck on said bolt received in said bore, a cavity in said shroud, an inner surface of said shroud defining said cavity, a shank on said bolt received in said U-nut, a head on said bolt in said cavity, a key-receiving configuration on said head, and said shroud including an outer frustoconical surface.

\* \* \* \* \*